(12) United States Patent
Matsumura et al.

(10) Patent No.: US 10,416,241 B2
(45) Date of Patent: Sep. 17, 2019

(54) BATTERY LIFE ESTIMATION BASED ON MULTIPLE LOCATIONS

(71) Applicant: INTEL CORPORATION, Santa Clara, CA (US)

(72) Inventors: Naoki Matsumura, San Jose, CA (US); Allen Huang, Beaverton, OR (US); Gang Ji, Santa Clara, CA (US); Brian C. Fritz, Milpitas, CA (US); William T. Glennan, Folsom, CA (US); Ramakrishna Ram Pallala, Bangalore (IN); Hung T. Tran, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 72 days.

(21) Appl. No.: 15/529,332

(22) PCT Filed: Nov. 20, 2015

(86) PCT No.: PCT/US2015/061819
§ 371 (c)(1),
(2) Date: May 24, 2017

(87) PCT Pub. No.: WO2016/105735
PCT Pub. Date: Jun. 30, 2016

(65) Prior Publication Data
US 2017/0307694 A1    Oct. 26, 2017

(30) Foreign Application Priority Data

Dec. 23, 2014 (IN) .......................... 6507/CHE/2014

(51) Int. Cl.
*G01R 31/392* (2019.01)
*G01R 31/374* (2019.01)
(Continued)

(52) U.S. Cl.
CPC ............ *G01R 31/392* (2019.01); *G01K 1/00* (2013.01); *G01R 31/3648* (2013.01);
(Continued)

(58) Field of Classification Search
CPC ........... G01R 31/3679; G01R 31/3689; G01R 31/3675; G01R 31/3606; G01R 31/392;
(Continued)

(56) References Cited

U.S. PATENT DOCUMENTS

2009/0037145 A1    2/2009 Suzuki et al.
2010/0161257 A1    6/2010 Cornett et al.
(Continued)

OTHER PUBLICATIONS

Extended European Search Report dated Aug. 22, 2018 for European Application No. 15873948.2, 7 pages.
(Continued)

*Primary Examiner* — Toan M Le
(74) *Attorney, Agent, or Firm* — Schwabe, Williamson & Wyatt, P.C.

(57) ABSTRACT

In embodiments, an apparatus may include a battery life monitor. The battery life monitor may, in some embodiments, receive a battery level indicator indicative of a current charge level of a battery that is coupled with the apparatus and a first temperature that may indicate a temperature of a current location of the apparatus. The battery life monitor may also receive one or more additional temperatures that indicate respective temperatures of one or more locations in which the apparatus is likely to be operated prior to discharge of the current charge level of the battery. Based at least in part on the current charge level, the first temperature indicator, and the one or more additional temperatures, the battery life monitor may calculate one or
(Continued)

more battery life estimates that correspond with the one or more locations. Other embodiments may be described and/or claimed.

20 Claims, 4 Drawing Sheets

(51) Int. Cl.
*G01R 31/371* (2019.01)
*G01R 31/382* (2019.01)
*G01S 19/42* (2010.01)
*G01S 5/00* (2006.01)
*G01K 1/00* (2006.01)
*G01R 31/36* (2019.01)

(52) U.S. Cl.
CPC ......... *G01R 31/371* (2019.01); *G01R 31/374* (2019.01); *G01R 31/382* (2019.01); *G01S 5/0027* (2013.01); *G01S 19/42* (2013.01)

(58) Field of Classification Search
CPC .. G01R 31/382; G01R 31/374; G01R 31/371; G01S 19/42; G01S 5/0027
See application file for complete search history.

(56) References Cited

U.S. PATENT DOCUMENTS

| | | |
|---|---|---|
| 2012/0316810 A1 | 12/2012 | Syed et al. |
| 2013/0204456 A1 | 8/2013 | Tippelhofer et al. |
| 2014/0129163 A1 | 5/2014 | Betzner |
| 2014/0342193 A1 | 11/2014 | Mull et al. |
| 2016/0077159 A1* | 3/2016 | Petrucelli ............. G01R 31/362 324/426 |

OTHER PUBLICATIONS

International Search Report and Written Opinion dated Mar. 28, 2016 for International Application No. PCT/US2015/061819, 12 pages.

\* cited by examiner

BATTERY LIFE ESTIMATION BASED ON MULTIPLE LOCATIONS

CROSS REFERENCE TO RELATED APPLICATIONS

The present application is a national phase entry under 35 U.S.C. § 371 of International Application No. PCT/US2015/061819, filed Nov. 20, 2015, entitled "BATTERY LIFE ESTIMATION BASED ON MULTIPLE LOCATIONS", which claims priority to Indian Application 6507/CHE/2014, filed Dec. 23, 2014, entitled "BATTERY LIFE ESTIMATION BASED ON MULTIPLE LOCATIONS." PCT/US2015/061819 designated, among the various States, the United States of America. The Specification of the PCT/US2015/061819 Application is hereby incorporated by reference.

TECHNICAL FIELD

Embodiments of the present disclosure are related to the field of power management, and in particular, to battery life estimation based on multiple locations.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Batteries are used in a wide range of products to enable the products to operate without the need to be tethered to an electrical outlet. People have begun to rely more and more on battery powered products from cellular phones to laptop computers and even hybrid or fully electric automobiles. As such, accurate information regarding remaining capacity of a battery may be important. The remaining capacity of a battery may fluctuate based on the ambient temperature to which the battery is exposed. Under the current state of the art, however, remaining battery capacity is only measured at a single temperature of a current location of a product without regard for other temperatures to which the product may be exposed.

DETAILED DESCRIPTION OF ILLUSTRATIVE EMBODIMENTS

Methods, computer-readable media, and apparatuses associated with battery life estimation based on multiple locations are discussed herein. In embodiments, an apparatus may include a battery life monitor. The battery life monitor may receive a battery level indicator that indicates a current charge level of a battery of the apparatus and a first temperature of a current location of the apparatus. The battery life monitor may receive one or more additional temperatures that indicate respective temperatures of one or more locations in which the apparatus is likely to be operated prior to discharge of the current charge level of the battery. In embodiments, the battery life monitor may then calculate one or more battery life estimates that correspond with the one or more locations, based at least in part on the current charge level, the first temperature, and the one or more additional temperatures. These one or more battery life estimates may, in some embodiments, then be output or utilized by the battery life monitor to enable power management of the apparatus based on the one or more battery life estimates.

In the following detailed description, reference is made to the accompanying drawings which form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C). The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Figure 1:
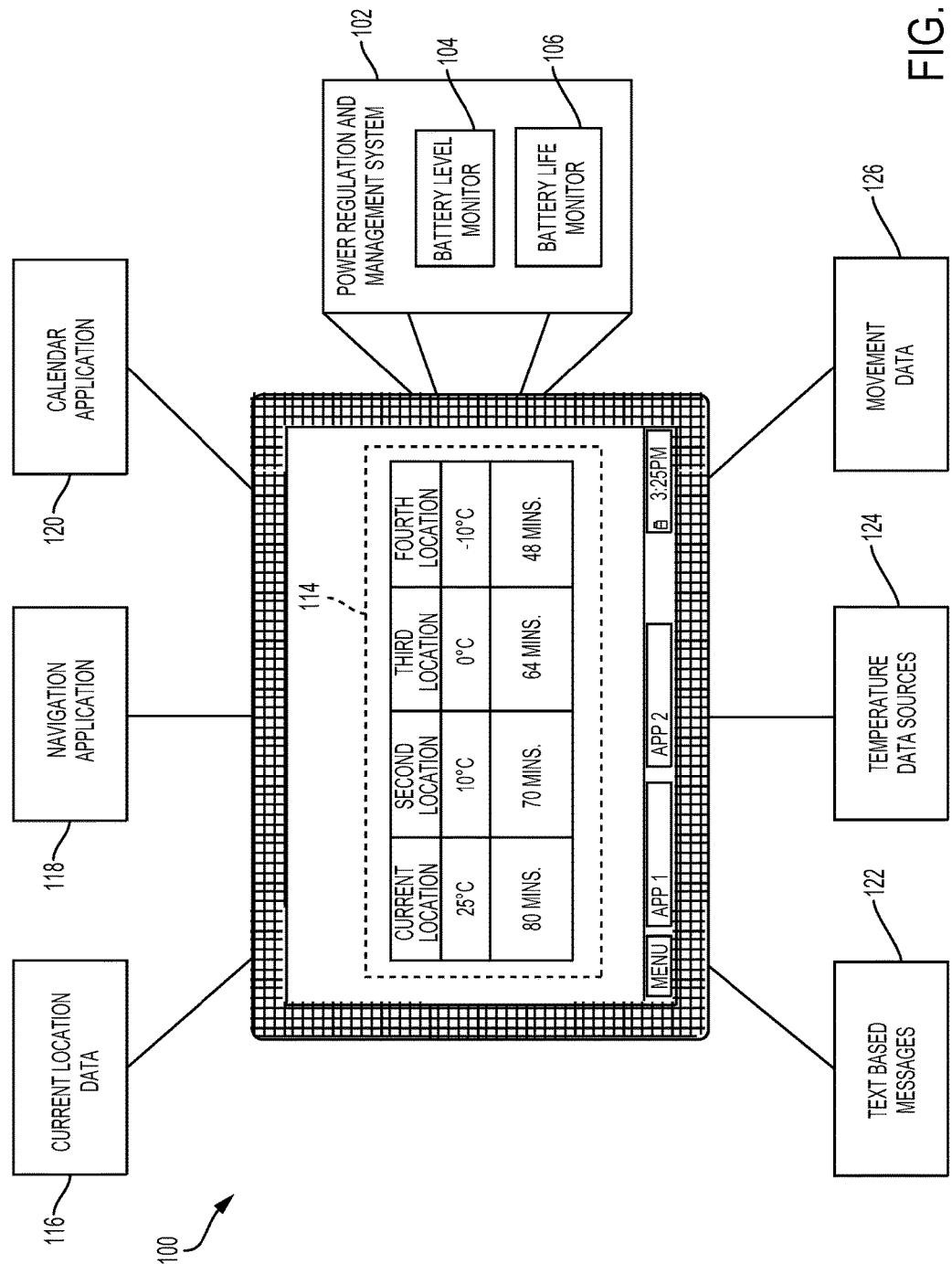
FIG. 1 depicts an illustrative computing apparatus, in accordance with various embodiments of the present disclosure.

FIG. 1 depicts a computing apparatus 100, in accordance with various embodiments of the present disclosure. In embodiments, computing apparatus 100 may include a power regulation and management system 102. Power regulation and management system 102 may include a battery level monitor 104 coupled with a battery life monitor battery 106.

In embodiments, battery level monitor 104 may be configured to measure a current charge level of a battery of computing apparatus 100. In such embodiments, battery level monitor 104 may be configured to measure the current charge level of the battery through any conventional means, including, but not limited to voltage readings, amperage readings, battery age measurements, battery state-of-charge (SOC) measurements, etc. Battery level monitor 104 may be further configured to monitor a temperature of a current location of the apparatus. Such temperature monitoring may be accomplished, in some embodiments, through the utilization of a thermistor, such as thermistor 328 of FIG. 3, or other temperature measurement device integrated with computing apparatus 100. In other embodiments, such temperature monitoring may be accomplished by monitoring one or more external data sources depicted here as temperature data sources 124. Temperature data sources 124 may include, for example, a temperature reading of an internet of things (IOT) edge device or a meteorological data source (e.g., the National Oceanic and Atmospheric Administration (NOAA)). In embodiments, temperature data sources 124 may be accessible to computing apparatus via one or more communication interfaces, such as, for example, communication interface 312 discussed in reference to FIG. 3.

Battery life monitor 106 may be configured to receive, from battery level monitor 104, a battery level indicator that indicates a current charge level of the battery. In addition, battery life monitor 106 may be configured to receive the temperature of the current location of the apparatus from the battery level monitor. Battery life monitor may be further configured to receive one or more additional temperatures of one or more locations. In embodiments, these one or more locations may correspond with locations in which computing apparatus 100 is likely to be operated prior to discharge of the current charge level of the battery. These one or more locations are discussed in greater detail below. In embodiments, these one or more additional temperatures may be received from the above discussed temperature data sources 124.

Battery life monitor 106 may be configured to calculate one or more battery life estimates that correspond with the one or more locations. Such battery life estimates may, in some embodiments, be based, at least in part, on the current charge level, the first temperature, and the one or more additional temperatures. For example, based upon the current charge level and the first temperature, the battery life monitor may be able to extrapolate battery life estimates for the one or more additional temperatures.

In some embodiments, battery life monitor 106 may be configured to receive the one or more locations in which computing apparatus 100 is likely to be operated from another component, or service, integrated with or external to computing apparatus 100. In such embodiments, the another component, or service, may be configured to determine the one or more locations in a similar manner to that described below in reference to battery life monitor 106. In other embodiments, battery life monitor 106 may be configured to determine the one or more locations. Regardless of the place at which the one or more locations may be determined the process of determining the one or more locations may be the same as that described below.

In embodiments, battery life monitor 106 may be configured to determine the one or more locations based on data received from one or more of a plurality of different data sources. In some embodiments, the one or more locations may be based on a current location of the apparatus defined by current location data 116 (e.g., global positioning satellite (GPS) coordinates). In such embodiments, battery life monitor 106 may be configured to determine a perimeter around the current location to be utilized in limiting the one or more locations to locations within the determined perimeter. Such a perimeter may be variable and may depend on any number of factors. For example, such a determined perimeter may depend on a speed at which computing apparatus 100 is traveling. For instance, if the speed of computing apparatus 100 is indicative of a user walking with computing apparatus 100 the perimeter may be smaller than if the speed of computing apparatus 100 is indicative of a user at a higher speed of travel (e.g., by bicycle, automobile, locomotive, plane, etc.). In addition, such a perimeter may be further based, for example, on the current charge level of the battery of computing apparatus. For instance, if the current charge level of the battery indicates a sufficient charge level to maintain current operations of computing apparatus 100 for X minutes, then the perimeter may include only those locations that are reachable at the current rate of speed within X minutes.

In further embodiments, battery life monitor 106 may be further configured to determine the one or more locations based on movement data 126 associated with the current location. Movement data 126 may include data concerning previously monitored movements of computing apparatus 100 at the current location. In embodiments, movement data 126 may take the form of a series of GPS coordinates that indicate the previous movement of computing apparatus 100 at the current location. Battery life monitor 106 may be configured to analyze movement data 126 to infer one or more locations at which the computing apparatus is likely to be operated. As discussed above, these locations may be limited to locations within a determined perimeter of the current location. In embodiments, movement data 126 may be stored locally on computing apparatus 100 (e.g., in mass storage 308 of FIG. 3). In other embodiments, movement data 126 may be stored external to computing apparatus 100 (e.g., in a cloud computing environment). In such embodiments, battery life module 106 may be configured to request the movement data 126 via one or more communication interfaces of computing apparatus 100 (e.g., communication interface 312 of FIG. 3).

In still further embodiments, battery life monitor 106 may be further configured to determine the one or more locations based on information received from a navigation application 118. Navigation application 118 may be integrated with computing apparatus 100 or may be accessible to computing apparatus 100 through one or more communication interfaces of computing apparatus 100 (e.g., communication interface 312 of FIG. 3). In such embodiments, the one or more locations may be based on one or more waypoints along a route being navigated by navigation application 118. For example, if navigation application 118 indicates that the computing apparatus is being transported from San Francisco to San Jose, then the way point may include San Jose as well as other way points between San Francisco and San Jose in the one or more locations. It will be appreciated that such way points may be more or less granular in nature. For example, navigation application 118 may indicate a specific location (e.g., bar, restaurant, etc.) to which computing apparatus 100 is being transported to in San Jose and this specific location may be one of the way points, rather than the less granular location of San Jose. As discussed above, these way points may be limited to those way points within a determined perimeter of the current location of computing apparatus 100.

In still further embodiments, battery life monitor 106 may be configured to determine the one or more locations based on information from calendar application 118. Calendar application 118 may be integrated with computing apparatus 100 or may be accessible to computing apparatus 100 through one or more communication interfaces of computing apparatus (e.g., communication interface 312 of FIG. 3). In such embodiments, the one or more locations may be based on one or more locations associated with appointments or events of a user of computing apparatus 100 defined within calendar application 120. For example, if the current location indicates that computing apparatus 100 is in Miami, but a calendar associated with a user of computing apparatus 100 indicates that the user is scheduled to fly from Miami to Minneapolis, then the battery life monitor 106 may include Minneapolis as one of the one or more locations. In embodiments, the calendar appointments or events may be limited to those appointments or events that are within a time period prior to discharge of the current charge level of the battery.

In still further embodiments, battery life monitor may be configured to determine, or extract, one or more locations from text based messages 122. Text based messages 122 may be integrated with computing apparatus 100 or may be accessible to computing apparatus 100 through one or more communication interfaces of computing apparatus (e.g., communication interface 312 of FIG. 3). For example, text based messages 122 may be short message service (SMS) text messages sent or received by computing apparatus 100 or may be email communications stored on, or accessible to, computing apparatus 100, or any combination thereof. In such embodiments, the one or more locations may be based on one or more locations mentioned in text based messages 122. For example, if the current location indicates that computing apparatus 100 is at a location in Denver, but an email indicates that the user of computing apparatus 100 is to meet with another person in Aspen, then Aspen may be included as one of the one or more locations. As with the calendar appointments or events discussed above, any locations determined, or extracted, from text based messages 122 may be limited to locations having a time associated with them that is within a time period prior to discharge of the current charge level of the battery.

It will be appreciated that the above discussed processes that may be utilized to determine the one or more locations in which computing apparatus 100 is likely to be used are merely meant to be illustrative of possible mechanisms for determining the one or more locations. Additional mechanisms may be utilized without departing from the scope of the present disclosure. In addition, any combination of such mechanisms may be utilized without departing from the scope of the present disclosure.

Regardless of whether battery life monitor 106 receives or determines the one or more locations, in such embodiments, battery life monitor 106 may request from temperature data sources 124 temperatures of the one or more locations. As mentioned above, in some embodiments, the one or more locations may be determined by a component or service external to battery life monitor 106. In such embodiments, battery life monitor may merely receive the one or more temperatures without the need to determine the one or more locations or request the corresponding one or more temperatures.

In embodiments, battery life monitor 106 may be further configured to utilize the one or more battery life estimates to enable power management of computing apparatus 100 based on at least one of the one or more battery life estimates. In other embodiments, battery life monitor 106 may be configured to output (e.g., to an operating system (OS) of computing apparatus 100), at least one of the one or more battery life estimates to enable power management of computing apparatus 100 based on the at least one of the one or more battery life estimates. For example, battery life monitor 106 may determine a worst-case scenario of battery life based on the temperatures of the one or more locations. The battery life monitor may then perform power management tasks, such as dimming a display, throttling down one or more processors, etc., as if the current battery life is the same as that indicated by the estimated worst-case scenario battery life or output the worst-case scenario to enable, for example, the OS to perform such power management tasks. It will be appreciated that the above worst-case scenario example is merely meant to be illustrative and that power management tasks may be based any of the one or more battery life estimates.

In other embodiments, battery life monitor 106 may be configured to output at least one of the one or more battery life estimates, for example to an OS, to be displayed to a user to enable the user to make power management decisions based on the one or more battery life estimates. For example, as depicted by box 114, the one or more battery life estimates of various locations may be displayed to a user to make the user aware of the possible scenarios. In some embodiments, the user may be able to select one of these battery life estimates from the display to utilize the selected battery life estimate in the power management of computing apparatus 100.

In an effort to further illustrate some of the above discussion, box 114 depicts an example display including one location in which computing apparatus 100 is currently located and three different locations in which computing apparatus is likely to be used. For instance, computing apparatus 100 may be a cellular phone. The user of computing apparatus 100 may be inside of a ski lodge, as a result, the temperature at the current location may be a relatively moderate 25° C. Such a temperature may be measured utilizing a thermistor of computing apparatus 100, such as thermistor 328 of FIG. 3. The current battery life may be 80 minutes based on the current battery level of computing apparatus 100. The second location may be a breezeway of the ski lodge, which may be a location inferred from movement data indicating that the user previously utilized the breezeway for a phone conversation. The temperature at this second location may be 10° C. Such a temperature may be measured by an IOT device located in the breezeway that computing apparatus 100 may have access to the output of. The estimated battery life calculated by battery life monitor 106 at this temperature may be 70 minutes. The third location may be an area immediately surrounding the ski lodge that may be determined merely based upon its proximity to the current location of computing apparatus 100. The temperature of this third location may be 0° C. Such a temperature may be acquired via an online resource accessible by computing device 100 (e.g., NOAA). At this temperature, the estimated battery life calculated by battery life monitor 106 may be reduced further to 64 minutes. The fourth location may be a summit of the mountain that the ski lodge is located on. Such a location may be determined based upon a text message that the user received from a friend indicating that the user is to meet the friend at the summit in 15 minutes to ski down the mountain with the friend. The temperature of this fourth location may be −10° C. Such a temperature may be acquired from a website of the ski lodge that is accessible by computing apparatus 100 that indicates the temperature at the summit. At this temperature, the estimated battery life calculated by battery life monitor 106 may be reduced further to 48 minutes. From this information the user can determine what power management steps to take in an attempt to conserve battery life if necessary or may decide to charge the battery for a period of time before moving on to one of these locations.

While computing apparatus 100 is referred to as a cellular phone above, it will be appreciated that computing apparatus may be any apparatus that may be dependent upon battery power. Such apparatuses may include, but are not limited to wearable devices, laptop computers, netbook computers, notebook computers, ultrabook computers, smartphones, tablets, personal digital assistants (PDAs), ultra mobile PCs, mobile phones, portable music players, cameras, camcorders, or even an automobile, such as a hybrid automobile or an all-electric automobile.

Figure 2:
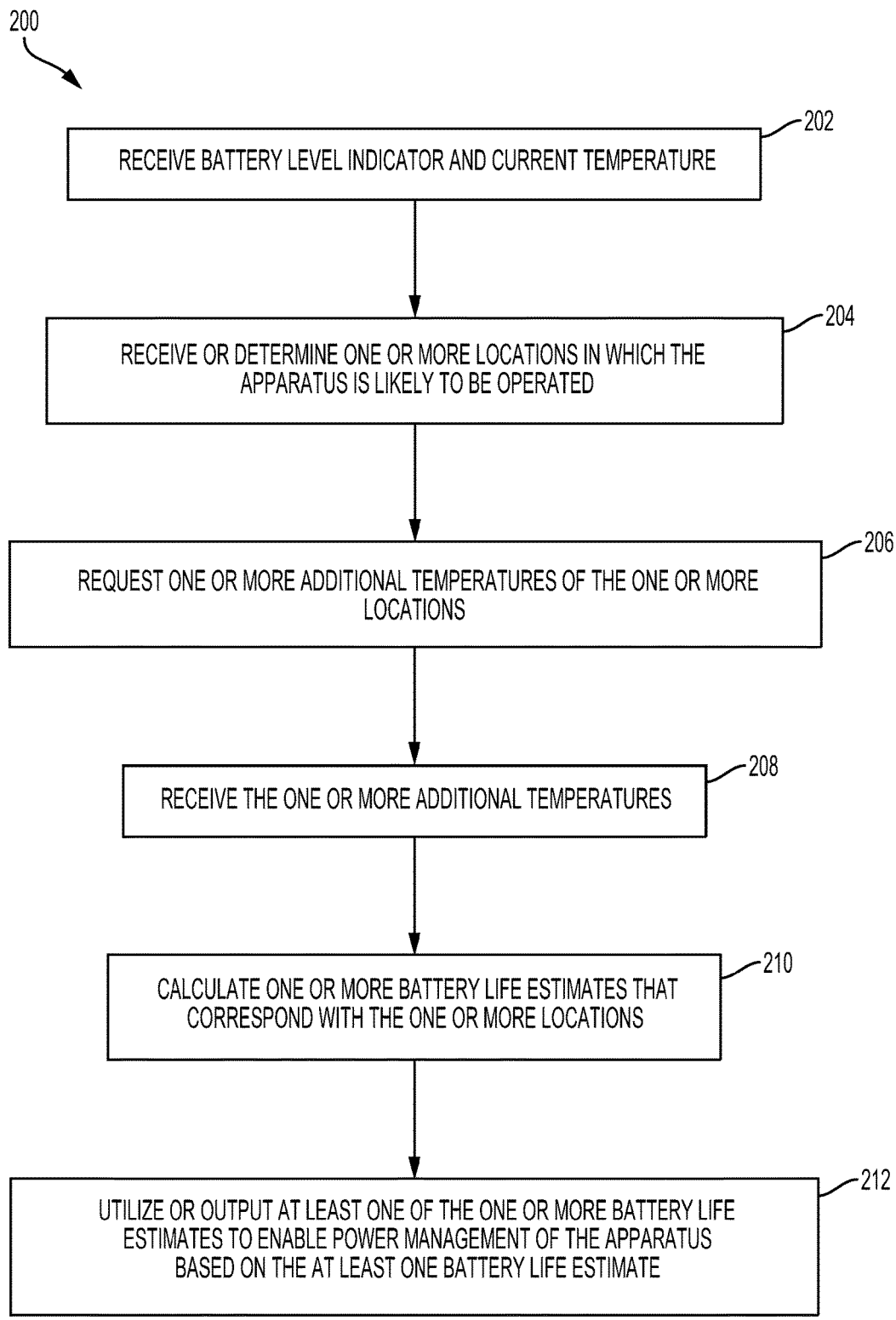
FIG. 2 illustrates an example process flow for monitoring battery life, in accordance with various embodiments of the present disclosure.

FIG. 2 illustrates an example process flow for battery life monitoring, in accordance with various embodiments of the present disclosure. In embodiments, such a process flow may be carried out, for example, by an apparatus having a battery life monitor (e.g., battery life monitor 106 of FIG. 1) integrated therewith. The process flow may begin at block 202 where the battery life monitor may receive a battery level indicator that indicates a current charge level of the battery and a temperature of the current location of the apparatus.

At block 204, battery life monitor may determine one or more locations in which the apparatus is likely to be operated. Such a determination may be made in a similar manner to that described in reference to FIG. 1, above. At block 206, one or more additional temperatures of the one or more locations may be requested by the battery life monitor. Such a request may be submitted to one or more available resources, such as temperature data sources 124 of FIG. 1, via one or more communication interfaces. It will be appreciated that, in some embodiments, the processes of block 204 and block 206 may be omitted. In such embodiments, the resulting process may move from block 202 to block 208.

At block 208, the one or more additional temperatures may be received by the battery life monitor. Such temperatures may be received via one or more communication interfaces of the apparatus. At block 210, the battery life monitor may calculate one or more battery life estimates that correspond with the one or more locations based on the one or more additional temperatures received at block 208.

Finally, at block 212, battery life monitor may utilize or output at least one of the one or more battery life estimates to enable power management of the apparatus based on the at least one battery life estimate. Such utilization, output, and power management are discussed in greater detail in reference to FIG. 1, above.

Figure 3:
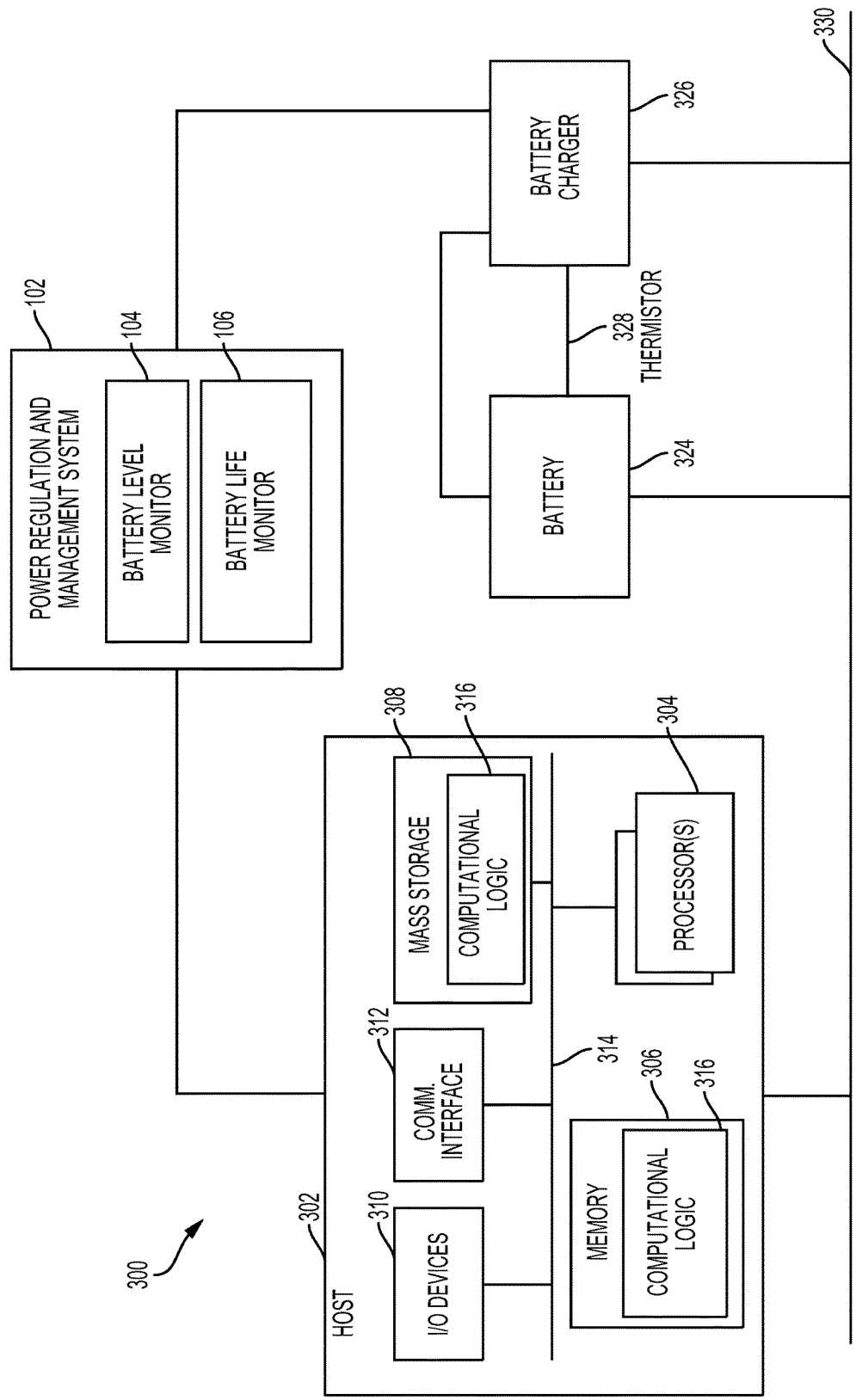
FIG. 3 is a schematic illustration of an example computing apparatus, in accordance with various embodiments of the present disclosure.

Referring now to FIG. 3, wherein an example computing apparatus 300 suitable to implement a battery life monitoring configuration, in accordance with various embodiments, is illustrated. As shown, apparatus 300 may include host 302, power regulation and management system 102, battery 324, battery charger 326, and thermistor 328. In some embodiments, power regulation and management system 102, battery 324, and battery charger 326 may be integrated into host 302; however, for ease of description, these components are depicted as separate from host 302.

In embodiments, power regulation and management system 102 may include battery level monitor 104 and battery life monitor 106. These components may be configured to function as described in reference to FIG. 1, above. In other embodiments, battery level monitor 104 and/or battery life monitor 106 may be implemented in whole or in part in computational logic 316 or battery charger 326. Such embodiments, are discussed further below.

In embodiments, host 302 may include one or more processors or processor cores 304, and memory 306. In embodiments, multiple processor cores 304 may be disposed on one die. In some embodiments, one or more of processors 304 may be microcontrollers that may be configured by computational logic 316 to perform any of the above described processes or any portion thereof. For the purpose of this application, including the claims, the terms "processor" and "processor cores" may be considered synonymous, unless the context clearly requires otherwise. Additionally, apparatus 300 may include a mass storage device 308 (such as diskette, hard drive, compact disc read-only memory (CD-ROM), and so forth), input/output (I/O) device(s) 310 (such as camera, display device, keyboard, cursor control, gyroscope, accelerometer, and so forth), and communication interfaces 312 (such as network interface cards, modems, and so forth).

In embodiments, a display device may be touch screen sensitive and may include a display screen, one or more processors, storage medium, and communication elements. Further, it may be removably docked or undocked from a base platform having the keyboard. The elements may be coupled to each other via system bus 314, which may represent one or more buses. In addition, battery 324 and battery charger 326 may be communicatively coupled with host 302 via bus 330. In some embodiments, bus 330 may be integrated with bus 314. In the case of multiple buses, they may be bridged by one or more bus bridges (not shown). In some embodiments, either or both of battery level monitor 104 or battery life monitor 106 may be integrated into an enclosure of battery 324. In other embodiments, power regulation and management system 102 may be a power management integrated circuit configured to provide operational power to components of host 302.

Each of these elements may perform its conventional functions known in the art. In particular, memory 306 and mass storage device 308 may be employed to store a working copy and a permanent copy of programming instructions implementing one or more of the operations described earlier, e.g., but not limited to, operations described above in reference to FIGS. 1 and 2. The various operations may be implemented by assembler instructions supported by processor(s) 304 or high-level languages, such as, for example, C, that may be compiled into such instructions.

The permanent copy of the programming instructions may be placed into permanent mass storage device(s) 308 in the factory, or in the field, through, for example, a distribution medium (not shown), such as a compact disc (CD), or through communication interface 312 (from a distribution server (not shown)). That is, one or more distribution media having an implementation of one or more processes described in reference to FIG. 1 or 2 may be employed to distribute these components to various computing devices.

The number, capability, and/or capacity of these elements 304-314 may vary, depending on the intended use of example computing apparatus 300, e.g., whether example computing apparatus 300 is a wearable device, laptop computer, netbook computer, notebook computer, ultrabook computer, smartphone, tablet, personal digital assistant (PDA), ultra mobile PC, mobile phone, portable music player, camera, camcorder, or even an automobile, such as a hybrid automobile or an all-electric automobile. The constitutions of these elements 304-314 are otherwise known, and accordingly will not be further described.

Figure 4:
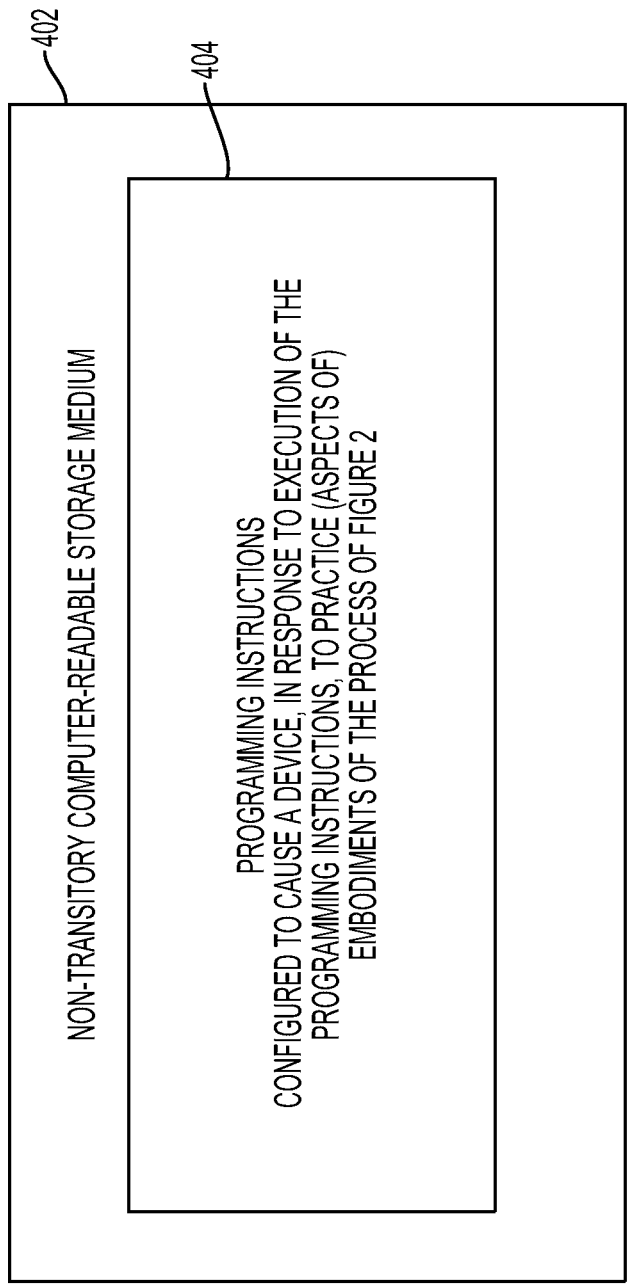
FIG. 4 illustrates an example non-transitory computer-readable storage medium having instructions configured to practice all or selected ones of the operations associated with the processes described above.

FIG. 4 illustrates an example non-transitory computer-readable storage medium having instructions configured to practice all or selected ones of the operations associated with the processes described above. As illustrated, non-transitory computer-readable storage medium 402 may include a number of programming instructions 404. Programming instructions 404 may be configured to enable a device, e.g., computing apparatus 300, in response to execution of the programming instructions, to perform one or more operations of the processes described in reference to FIGS. 1 and 2. In alternate embodiments, programming instructions 404 may be disposed on multiple non-transitory computer-readable storage media 402 instead. In still other embodiments, programming instructions 404 may be encoded in transitory computer-readable medium, such as signals.

Referring back to FIG. 3, for one embodiment, at least one of processors 304 may be packaged together with memory having computational logic 316 (in lieu of storing in memory 306 and/or mass storage 308) configured to perform one or more operations of the processes described with reference to FIGS. 1 and 2. For one embodiment, at least one of processors 304 may be packaged together with memory having computational logic 316 configured to practice aspects of the methods described in reference to FIGS. 1 and 2 to form a System in Package (SiP). For one embodiment, at least one of processors 304 may be integrated on the same die with memory having computational logic 316 configured to perform one or more operations of the processes described in reference to FIGS. 1 and 2. For one embodiment, at least one of processors 304 may be packaged together with memory having computational logic 316 configured to perform one or more operations of the process described in reference to FIGS. 1 and 2 to form a System on Chip (SoC). Such an SoC may be utilized in any suitable computing device.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

Embodiments of the disclosure can take the form of an entirely hardware embodiment, an entirely software embodiment or an embodiment containing both hardware and software elements. In various embodiments, software, may include, but is not limited to, firmware, resident software, microcode, and the like. Furthermore, the disclosure can take the form of a computer program product accessible from a computer-usable or computer-readable medium providing program code for use by or in connection with a computer or any instruction execution system. As used herein, module may refer to a software module, a hardware module, or any number or combination thereof.

As used herein, the term module or monitor includes logic that may be implemented in a hardware component or device, software or firmware that may be run or running on a processor, or a combination of processors. The modules or monitors may be distinct and independent components integrated by sharing or passing data, or the modules or monitors may be subcomponents of a single module or monitor, or be split among several modules or monitors. The components may be processes running on, or implemented on, a single compute node or distributed among a plurality of compute nodes running in parallel, concurrently, sequentially or a combination, as described more fully in conjunction with the flow diagrams in the figures.

For the purposes of this description, a computer-usable or computer-readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

EXAMPLES

Some non-limiting examples are: Example 1 may include an apparatus comprising: a battery level monitor to measure a current charge level of a battery coupled with the apparatus and a first temperature of a current location of the apparatus; and a battery life monitor coupled with the battery level monitor to: receive, from the battery level monitor, a battery level indicator that indicates a current charge level of the battery and the first temperature; receive one or more additional temperatures that indicate respective temperatures of one or more locations in which the apparatus is likely to be operated prior to discharge of the current charge level of the battery; and calculate one or more battery life estimates that correspond with the one or more locations, based at least in part on the current charge level, the first temperature, and the one or more additional temperatures.

Example 2 may include the subject matter of Example 1, wherein the battery life monitor is further to: receive or determine the one or more locations in which the apparatus is likely to be operated; and request the one or more additional temperatures of the one or more locations from one or more data sources accessible to the apparatus.

Example 3 may include the subject matter of Example 2, wherein the one or more locations are inferred from previously collected movement data concerning movements of the apparatus at the current location to infer at least one of the one or more locations.

Example 4 may include the subject matter of Example 3, wherein the movement data includes GPS coordinates generated by a GPS system.

Example 5 may include the subject matter of any one of Examples 2-4, wherein the one or more locations include one or more of: one or more waypoints defined by a navigation application accessible to the apparatus; one or more locations associated with appointments or events defined in a calendar application accessible to the apparatus; or one or more locations extracted from text based messages sent or received by a user of the apparatus.

Example 6 may include the subject matter of any one of Examples 1-5, wherein the battery life monitor is further to: utilize or output at least one of the one or more battery life estimates to enable power management of the apparatus based at least in part on the one or more battery life estimates.

Example 7 may include the subject matter of any one of Examples 1-6, wherein the battery life monitor is to utilize or output a worst case battery life estimate based on the one or more additional temperatures to enable power management of the apparatus based on the worst case battery life estimate.

Example 8 may include the subject matter of any one of Examples 1-7, wherein the battery life monitor is further to: output at least one of the one or more battery life estimates for display to a user of the apparatus.

Example 9 may include the subject matter of any one of Examples 1-8, wherein the apparatus is a wearable device, a laptop computer, a netbook computer, a notebook computer, an ultrabook computer, a smartphone, a tablet, a personal digital assistant (PDA), an ultra mobile PC, a mobile phone, a portable music player, a camera, a camcorder, or an automobile.

Example 10 may include a method for estimating battery life, comprising: receiving, by a battery life monitor of an apparatus, a battery level indicator that indicates a current charge level of a battery of the apparatus and a first temperature that indicates a temperature of a current location of the apparatus; receiving, by the battery life monitor, one or more additional temperatures that indicate respective temperatures of one or more locations in which the apparatus is likely to be operated prior to discharge of the current charge level of the battery; and calculating, by the battery life monitor, one or more battery life estimates that correspond with the one or more locations based at least in part on the current charge level, the first temperature, and the one or more additional temperatures.

Example 11 may include the subject matter of Example 10, further comprising: receiving or determining, by the battery life monitor, the one or more locations in which the apparatus is likely to be operated; and requesting, by the battery life monitor, the one or more additional temperatures of the one or more locations from one or more data sources accessible to the apparatus.

Example 12 may include the subject matter of Example 11, wherein at least one of the one or more locations is inferred from previously collected movement data concerning movements of the apparatus at the current location.

Example 13 may include the subject matter of Example 12, wherein the movement data includes GPS coordinates generated by a GPS system.

Example 14 may include the subject matter of any one of Examples 11-13, wherein the one or more locations include one or more of: one or more waypoints defined by a navigation application accessible to the apparatus; one or more locations associated with appointments or events defined in a calendar application accessible to the apparatus; or one or more locations extracted from text based messages sent or received by a user of the apparatus.

Example 15 may include the subject matter of any one of Examples 10-14, further comprising: utilizing or outputting, by the battery life monitor, at least one of the one or more battery life estimates to enable power management of the apparatus based at least in part on the one or more battery life estimates.

Example 16 may include the subject matter of any one of Examples 10-15, further comprising: utilizing or outputting, by the battery life monitor, a worst case battery life estimate based on the one or more additional temperatures to enable power management of the apparatus based on the worst case battery life estimate.

Example 17 may include the subject matter of any one of Examples 10-16, further comprising: outputting, by the battery life monitor, at least one of the one or more battery life estimates for display to a user of the apparatus.

Example 18 may include one or more computer-readable media having instructions embodied thereon, wherein the instructions, in response to execution by a processor of an apparatus, provide the apparatus with a battery life monitor to: receive a battery level indicator that indicates a current charge level of a battery of the apparatus and a first temperature that indicates a temperature of a current location of the apparatus; receive one or more additional temperatures that indicate respective temperatures of one or more locations in which the apparatus is likely to be operated prior to discharge of the current charge level of the battery; and calculate one or more battery life estimates that correspond with the one or more locations, based at least in part on the current charge level, the first temperature, and the one or more additional temperatures.

Example 19 may include the subject matter of Example 18, wherein the battery life monitor is further to: receive or determine the one or more locations in which the apparatus is likely to be operated; and request the one or more additional temperatures of the one or more locations from one or more data sources accessible to the apparatus.

Example 20 may include the subject matter of Example 19, wherein at least one of the one or more locations is inferred from previously collected movement data concerning movements of the apparatus at the current location.

Example 21 may include the subject matter of Example 20, wherein the movement data includes GPS coordinates generated by a GPS system.

Example 22 may include the subject matter of any one of Examples 19-21, wherein the one or more locations include one or more of: one or more waypoints defined by a navigation application accessible to the apparatus; one or more locations associated with appointments or events defined in a calendar application accessible to the apparatus; or one or more locations extracted from text based messages sent or received by a user of the apparatus.

Example 23 may include the subject matter of any one of Examples 18-22, wherein the battery life monitor is further to: utilize or output at least one of the one or more battery life estimates to enable power management of the apparatus based at least in part on the one or more battery life estimates.

Example 24 may include the subject matter of any one of Examples 18-23, wherein the battery life monitor is further to: utilize or output a worst case battery life estimate based on the one or more additional temperatures to enable power management of the apparatus based on the worst case battery life estimate.

Example 25 may include the subject matter of any one of Examples 18-24, wherein the battery life monitor is further to: output at least one of the one or more battery life estimates for display to a user of the apparatus.

Example 26 may include an apparatus for battery life estimation, comprising: means for receiving a battery level indicator that indicates a current charge level of a battery of the apparatus and a first temperature that indicates a temperature of a current location of the apparatus; means for receiving one or more additional temperatures that indicate respective temperatures of one or more locations in which the apparatus is likely to be operated prior to discharge of the current charge level of the battery; and means for calculating one or more battery life estimates that correspond with the one or more locations based at least in part on the current charge level, the first temperature, and the one or more additional temperatures.

Example 27 may include the subject matter of 26, further comprising: means for receiving or determining the one or more locations in which the apparatus is likely to be operated; and means for requesting the one or more additional temperatures of the one or more locations from one or more data sources accessible to the apparatus.

Example 28 may include the subject matter of 27, wherein at least one of the one or more locations is inferred from previously collected movement data concerning movements of the apparatus at the current location.

Example 29 may include the subject matter of 28, wherein the movement data includes GPS coordinates generated by a GPS system.

Example 30 may include the subject matter of 27, wherein the one or more locations include one or more of: one or more waypoints defined by a navigation application accessible to the apparatus; one or more locations associated with appointments or events defined in a calendar application accessible to the apparatus; or one or more locations extracted from text based messages sent or received by a user of the apparatus.

Example 31 may include the subject matter of any one of Examples 26-30, further comprising: means for utilizing or outputting at least one of the one or more battery life estimates to enable power management of the apparatus based at least in part on the one or more battery life estimates.

Example 32 may include the subject matter of any one of Examples 26-31, further comprising: means for utilizing or outputting a worst case battery life estimate based on the one or more additional temperatures to enable power management of the apparatus based on the worst case battery life estimate.

Example 33 may include the subject matter of any one of Example 26-32, further comprising: means for outputting at least one of the one or more battery life estimates for display to a user of the apparatus.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the disclosure. This application is intended to cover any adaptations or variations of the embodiments discussed herein. Therefore, it is manifestly intended that the embodiments of the disclosure be limited only by the claims and the equivalents thereof.

What is claimed is:

1. An apparatus comprising:
   a battery level monitor to measure a current charge level of a battery coupled with the apparatus and a first temperature of a current location of the apparatus; and
   a battery life monitor coupled with the battery level monitor to:
   receive, from the battery level monitor, a battery level indicator that indicates a current charge level of the battery and the first temperature;
   identify, using information about a route being navigated or based on content of calendar entries or user communications to or from one or more remote devices, one or more locations in which the apparatus is likely to be operated prior to discharge of the current charge level of the battery;
   obtain one or more second current temperatures associated with the identified one or more locations, respectively;
   calculate one or more battery life estimates that correspond with the one or more locations, based at least in part on the current charge level, the first temperature, and the one or more second current temperatures; and
   output at least one of the one or more battery life estimates for display to a user of the apparatus.

2. The apparatus of claim 1, wherein obtain the one or more second current temperatures further comprises:
   request the one or more second current temperatures from one or more data sources accessible to the apparatus.

3. The apparatus of claim 2, wherein the one or more locations include one or more of:
   one or more waypoints defined by a navigation application accessible to the apparatus;
   one or more locations associated with appointments or events defined in the calendar entries; or
   one or more locations extracted from text based messages sent or received by a user of the apparatus.

4. The apparatus of claim 2, wherein the apparatus is a wearable device, a laptop computer, a netbook computer, a notebook computer, an ultrabook computer, a smartphone, a tablet, a personal digital assistant (PDA), an ultra mobile PC, a mobile phone, a portable music player, a camera, a camcorder, or an automobile.

5. The apparatus of claim 1, wherein the information about the route being navigated is based on Global Positioning System (GPS) coordinates generated by a GPS system.

6. The apparatus of claim 1, wherein the battery life monitor is further to:
   utilize or output at least one of the one or more battery life estimates to enable power management of the apparatus based at least in part on the one or more battery life estimates.

7. The apparatus of claim 1, wherein the battery life monitor is to utilize or output a worst case battery life estimate based on the one or more second current temperatures to enable power management of the apparatus based on the worst case battery life estimate.

8. A method for estimating battery life, comprising:
   receiving, by a battery life monitor of an apparatus, a battery level indicator that indicates a current charge level of the battery of the apparatus and a first temperature that indicates a temperature of a current location of the apparatus;
   identifying, using information about a route being navigated or based on content of calendar entries or user communications to or from one or more remote devices, one or more locations in which the apparatus is likely to be operated prior to discharge of the current charge level of the battery;
   obtaining one or more second current temperatures associated with the identified one or more locations, respectively;
   calculating, by the battery life monitor, one or more battery life estimates that correspond with the one or more locations based at least in part on the current charge level, the first temperature, and the one or more second current temperatures; and
   outputting, by the battery life monitor, at least one of the one or more battery life estimates for display to a user of the apparatus.

9. The method of claim 8, wherein obtaining the one or more second current temperatures further comprises further comprising:
   requesting, by the battery life monitor, the one or more second current temperatures from one or more data sources accessible to the apparatus.

10. The method of claim 9, wherein the one or more locations include one or more of:
one or more waypoints defined by a navigation application accessible to the apparatus;
one or more locations associated with appointments or events defined in the calendar entries; or
one or more locations extracted from text based messages sent or received by a user of the apparatus.

11. The method of claim 8, wherein the information about the route being navigated is based on Global Positioning System (GPS) coordinates generated by a GPS system.

12. The method of claim 8, further comprising:
utilizing or outputting, by the battery life monitor, at least one of the one or more battery life estimates to enable power management of the apparatus based at least in part on the one or more battery life estimates.

13. The method of claim 8, further comprising:
utilizing or outputting, by the battery life monitor, a worst case battery life estimate based on the one or more second current temperatures to enable power management of the apparatus based on the worst case battery life estimate.

14. One or more non-transitory computer-readable media having instructions embodied thereon, wherein the instructions, in response to execution by a processor of an apparatus, provide the apparatus with a battery life monitor to:
receive a battery level indicator that indicates a current charge level of a battery of the apparatus and the first temperature that indicates a temperature of a current location of the apparatus;
identify, using information about a route being navigated or based on content of calendar entries or user communications to or from one or more remote devices, one or more locations in which the apparatus is likely to be operated prior to discharge of the current charge level of the battery;
obtain one or more second current temperatures associated with the identified one or more locations, respectively;
calculate one or more battery life estimates that correspond with the one or more locations, based at least in part on the current charge level, the first temperature, and the one or more second current temperatures; and
output at least one of the one or more battery life estimates for display to a user of the apparatus.

15. The one or more non-transitory computer-readable media of claim 14, wherein obtain the one or more second current temperatures further comprises:
request the one or more second current temperatures of the one or more locations from one or more data sources accessible to the apparatus.

16. The one or more non-transitory computer-readable media of claim 15, wherein the one or more locations are based on:
one or more waypoints defined by a navigation application accessible to the apparatus;
one or more locations associated with appointments or events defined in the calendar entries; or
one or more locations extracted from text based messages sent or received by a user of the apparatus.

17. The one or more non-transitory computer-readable media of claim 16, wherein the battery life monitor is further to filter the one or more waypoints, the one or more locations associated with the appointments or events, or the one or more locations extracted from the text messages using the current charge level of the batter to identify the one or more locations in which the apparatus is likely to be operated prior to discharge of the current charge level of the battery.

18. The one or more non-transitory computer-readable media of claim 14, wherein the information about the route being navigated is based on Global Positioning System (GPS) coordinates generated by a GPS system.

19. The one or more non-transitory computer-readable media of claim 14, wherein the battery life monitor is further to:
utilize or output at least one of the one or more battery life estimates to enable power management of the apparatus based at least in part on the one or more battery life estimates.

20. The one or more non-transitory computer-readable media of claim 14, wherein the battery life monitor is further to:
utilize or output a worst case battery life estimate based on the one or more second current temperatures to enable power management of the apparatus based on the worst case battery life estimate.

* * * * *